US011477894B2

(12) United States Patent
Pudas

(10) Patent No.: US 11,477,894 B2
(45) Date of Patent: Oct. 18, 2022

(54) METHOD FOR FORMATION OF PATTERNED SOLDER MASK

(71) Applicant: PICOSUN OY, Espoo (FI)

(72) Inventor: Marko Pudas, Espoo (FI)

(73) Assignee: PICOSUN OY, Espoo (FI)

( * ) Notice: Subject to any disclaimer, the term of this patent is extended or adjusted under 35 U.S.C. 154(b) by 216 days.

(21) Appl. No.: 16/811,332

(22) Filed: Mar. 6, 2020

(65) Prior Publication Data

US 2020/0288580 A1 Sep. 10, 2020

(30) Foreign Application Priority Data

Mar. 8, 2019 (FI) .................................. 20195173

(51) Int. Cl.
*H05K 3/34* (2006.01)
*B23K 1/015* (2006.01)
*B23K 103/00* (2006.01)
*B23K 101/42* (2006.01)

(52) U.S. Cl.
CPC ........... *H05K 3/3452* (2013.01); *B23K 1/015* (2013.01); *H05K 3/3457* (2013.01); *B23K 2101/42* (2018.08); *B23K 2103/50* (2018.08)

(58) Field of Classification Search
CPC .... H05K 3/3452; H05K 3/3457; B23K 1/015; B23K 2103/50; B23K 2101/42
See application file for complete search history.

(56) References Cited

U.S. PATENT DOCUMENTS

| 4,659,650 | A | | 4/1987 | Moritz et al. |
| 5,789,271 | A | * | 8/1998 | Akram ................ H01L 21/4853 |
| | | | | 257/E23.067 |
| 8,211,325 | B2 | | 7/2012 | Diao et al. |
| 8,357,616 | B2 | | 1/2013 | Linder et al. |
| 9,899,311 | B2 | | 2/2018 | Manusharow et al. |
| 9,972,589 | B1 | | 5/2018 | Goh et al. |
| 2005/0048414 | A1 | | 3/2005 | Harnack et al. |
| 2010/0244280 | A1 | * | 9/2010 | Shimizu ................ H05K 3/28 |
| | | | | 257/784 |
| 2013/0335898 | A1 | * | 12/2013 | Stevens .................. H05K 3/284 |
| | | | | 361/679.01 |
| 2014/0048320 | A1 | | 2/2014 | Park et al. |
| 2014/0087090 | A1 | * | 3/2014 | Miyagawa .............. C23C 16/44 |
| | | | | 427/560 |

(Continued)

FOREIGN PATENT DOCUMENTS

CN 108369935 A 8/2018
EP 1510861 A1 3/2005
(Continued)

OTHER PUBLICATIONS

Extended European Search Report issued in European Patent Application No. 20161432.8 dated Jul. 21, 2020.
(Continued)

*Primary Examiner* — Jeffrey T Carley
(74) *Attorney, Agent, or Firm* — Nixon & Vanderhye

(57) ABSTRACT

A method for formation of a patterned solder mask (10) on a substrate is provided, in which method the mask is deposited by a process of chemical deposition in vapor phase. A method for manufacturing a printed circuit board and/or an electronic component comprising formation of said patterned solder mask is further provided.

16 Claims, 5 Drawing Sheets

(56) References Cited

U.S. PATENT DOCUMENTS

| | | | |
|---|---|---|---|
| 2014/0284386 A1* | 9/2014 | Finn | H01Q 7/06 |
| | | | 235/488 |
| 2018/0124926 A1* | 5/2018 | Modi | H05K 3/064 |
| 2018/0331062 A1 | 11/2018 | Schmajew | |
| 2019/0127853 A1 | 5/2019 | Pudas | |
| 2020/0066641 A1 | 2/2020 | Aygun et al. | |

FOREIGN PATENT DOCUMENTS

| | | | | |
|---|---|---|---|---|
| EP | 2711972 A1 | 3/2014 | | |
| EP | 3483308 A1 * | 5/2019 | | H01L 23/5226 |
| JP | H02-206195 A | 8/1990 | | |
| KR | 101507913 B1 | 4/2015 | | |
| WO | 2006/113492 A2 | 10/2006 | | |
| WO | WO-2010046235 A1 * | 4/2010 | | C25D 3/32 |
| WO | 2017/178690 A1 | 10/2017 | | |
| WO | 2018/009171 A1 | 1/2018 | | |

OTHER PUBLICATIONS

Väyrynen, "Photo-Assisted Atomic Layer Deposition and Chemical Vapor Deposition of Metal and Metal Oxide Thin Films", M.Sc. Thesis, Laboratory of Inorganic Chemistry, Department of Chemistry, University of Helsinki, 2016, <http://urn.fi/URN:NBN:fi-fe2017112251506>.

FI Search Report, dated Nov. 6, 2019, from corresponding FI application No. 20195173.

FI Office Action, dated Nov. 6, 2019, from corresponding FI application No. 20195173.

* cited by examiner

METHOD FOR FORMATION OF PATTERNED SOLDER MASK

FIELD OF THE INVENTION

The present invention generally relates to printed circuit boards and electrical components and methods of manufacturing thereof. In particular, the invention pertains to the methods concerning formation of patterned protective layer(s) by chemical vapor deposition.

BACKGROUND

Formation of solder mask- or solder resist protective layers on printed circuit boards (PCBs) is generally known in the art. Typical PCB comprises an epoxy substrate laid with a conductive material and further deposited with a layer that prevents solder (e.g. tin solder) wetting at reflow and its' contact to the underlying metal (copper or silver, for example).

Solder mask protects conductive material from corrosion induced by (air) oxidation and/or by the presence of sulfur containing contaminants in ambient air. Creep corrosion has turned out to be a serious problem in the large cities due to the presence of sulfur compounds, such as hydrogen sulfide ($H_2S$), in ambient air. Creep corrosion annually destroys thousands of circuit boards in server centers, for example, causing damages and losses estimated in several millions USD.

In many instances, solder mask is a polymer compound, such as described in the International Application publication WO 2018/009171. A major drawback associated with the use of organic polymer-based solder masks is that upon soldering, typically at about 250° C., organic material starts to fry, degas and may subsequently melt. The underlying conductive material becomes exposed to the ambient environment thus becoming more susceptible to corrosion. Organic vapors released upon subjecting polymer-based mask to high temperatures further cause contamination in soldering area(s); therefore (soldered) components get contaminated, accordingly.

Evaporation of said organic mask material is a major problem in space applications. For this reason some space agencies entirely forbid utilization of organic (polymeric) solder masks in PCBs and related electronic equipment at the objects of utmost importance, such as in (space) satellites.

Polymer-based solder resist layers are further disclosed in U.S. Pat. No. 9,899,311 (mask layer 58 micrometers, µm thick), and in U.S. Pat. No. 9,972,589 (mask layer at least 18 µm thick, compared to the underlying layer at most 15 µm thick).

Since polymer-based solder masks are typically applied by screen-printing, high lateral patterning resolution and/or deposition of layers less than 1 micrometer thick cannot be attained. Resolution limit for screen-printed solder masks is about 50 micrometers. Protective mask layer formed by screen-printing typically has same thickness as the underlying conductive layer. Formation of the mask by screen-printing is disclosed in KR101507913B.

Additionally, organic material is a poor moisture barrier. Upon diffusing through conventional polymeric solder masks atmospheric moisture causes oxidation and/or corrosion in PCB conductor layer(s) or in the other substrates, thus causing destruction of the PCBs.

Formation of solder masks may be attained by other methods, such as lamination, sputtering, printing, dispensing or chemical vapor deposition. Deposition of solder mask on a substrate 11 by conventional methods is illustrated on FIG. 1. FIG. 1 shows an exemplary process of manufacturing a printed circuit board having a base layer 1 laid with a conductive layer 2, onto which a solder mask 101 has been applied by conventional printing or dispensing processes, for example. From FIG. 1 one may observe that the mask 101 is not conformal. Places, in where the mask layer 101 lacks uniformity are indicated by dashed boxes. Thus, a via contact 4 completely lacks mask coating in the area indicated by arrow. Exposed conductor areas (copper, silver) are potentially impacted by corrosion.

In this regard, an update of technology in the field of manufacturing PCBs and/or electrical components is still desired, in view of addressing challenges associated with the application of solder mask layers.

SUMMARY OF THE INVENTION

An objective of the present invention is to solve or to at least alleviate each of the problems arising from the limitations and disadvantages of the related art. The objective is achieved by various embodiments of a method for formation of a patterned solder mask layer and a related method for manufacturing a printed circuit board and/or an electrical component. Thereby, in one aspect of the invention a method for formation of a patterned solder mask layer on a substrate is provided, in accordance to what is defined in the independent claim 1.

In preferred embodiment, the method for formation of a patterned solder mask layer on the substrate comprising apertures and/or non-planar surfaces by a process of chemical deposition in vapor phase is provided, wherein mask patterning is implemented via lift-off patterning with water-soluble lift-off material.

In embodiment, the lift-off material is water-soluble polymer. In some exemplary embodiment, the lift-off material is polyvinyl alcohol (PVA).

In embodiment, the mask is inorganic material. In some exemplary embodiment, the mask is metal oxide.

In embodiment, the mask is essentially optically transparent.

In embodiment, the substrate pre-supplied with the water-soluble lift-off material is degassed until a predetermined moisture level is attained.

It embodiment, the mask is deposited by a process of atomic layer deposition. In embodiment, the mask is deposited by a process of photo-assisted atomic layer deposition.

In embodiment, the mask is deposited at a temperature equal to or below 150° C., preferably, equal to or below 125° C. In embodiment, the mask is a layer having thickness within a range of 10-500 nm.

In embodiment, the substrate is a printed circuit board and/or an electrical component. In embodiment, the substrate is the printed circuit board with a number of electrical components attached thereto.

In another aspect of the invention, a method manufacturing a printed circuit board and/or an electrical component is provided, in accordance to what is defined in the independent claim 13. In embodiment, said method comprises depositing a patterned solder mask layer onto an underlying substrate, optionally, onto a conductive material by a process of chemical deposition in vapor phase, said substrate comprising apertures and/or non-planar surfaces, wherein patterning is implemented via lift-off patterning with water-soluble lift-off material.

In embodiment, the method further comprises depositing a protective layer onto a surface of the manufactured printed circuit board and/or the electrical component by the process of chemical deposition in vapor phase, preferably, by the process of atomic layer deposition.

In further aspect of the invention, an item comprising a patterned solder mask on a substrate is provided. In embodiment, the item is configured as a printed circuit board and/or an electrical component comprising a substrate with a base layer laid, at least partly, with a conductive material and a patterned solder mask deposited onto said substrate, optionally, onto a conductive material by a process of chemical deposition in vapor phase, wherein patterning is implemented via lift-off patterning with water-soluble lift-off material and wherein the substrate comprises apertures and/or non-planar surfaces.

The utility of the present invention arises from a variety of reasons depending on each particular embodiment thereof. At first, the method enables formation of solder mask coatings stable at high temperatures as required for soldering process (typically 250-300° C.). Thus, some materials most frequently utilized for the method, such as $Al_2O_3$, for example, are stable at temperatures above 1000° C. The method further allows for producing conformal mask coatings such, as to avoid formation of gaps (unmasked areas) on conductive layers. The mask is thus configured to provide conformal encapsulation for unmasked areas.

As a result, printed circuit boards and/or electrical components comprising mask layers deposited according to the present method(s) are less susceptible to corrosion, in particular, creep corrosion, which accounts for improved reliability of electronic devices incorporating mentioned appliances. Atomic layer deposition layers having conventional thickness (10-500 nm) demonstrate water vapour transmission rates (WVTR), also referred to as moisture vapor transmission rates (MVTR), at a level of about $10^{-6}$ g/m²/24 h.

Formation of patterns with high pattern resolution (less than 10 μm) can be achieved with various known methods, such as various printing methods or lithography of photoresist. Mentioned techniques are typically used in semiconductor industry for patterning layers deposited by chemical vapor deposition (CVD) or atomic layer deposition (ALD) with resolution below 100 nm. On the contrary, the invention exploits lift-off techniques for patterning. Importantly, the invention allows for generation of patterns on essentially planar surfaces comprising apertures (e.g. via contacts) for further attachment of electrical components by soldering, for example. The method further allows for patterning non-planar surfaces, such as those for wire tips, for example, by dipping mentioned objects into liquid (lift-off) polymer or a polymer solution, or by dispensing said lift-off polymer by any appropriate means, such as by a 3D printer. By depositing substrates with thin films patterned with high-precision, the method disclosed hereby further allows for mask application at the regions comprising apertures for contact pads and/or for high precision measurement electrodes.

By creating masked and maskless areas in a pre-designed manner, horizontal flow of liquid solder alloys onto undesired areas can be effectively prevented. Prevention of solder spread constitutes a common use for solder masks; however, in the present disclosure horizontal flow of liquid solder is realized with much greater precision (in particular, around via-apertures). Moreover, the method disclosed is versatile in a sense that it allows for deposition of the mask onto a part of a substrate and onto an entire substrate, such as a printed circuit board, for example.

In the present disclosure, materials with a layer thickness below 1 micrometer (μm) are referred to as "thin films".

The expression "a number of" refers in the present disclosure to any positive integer starting from one (1), e.g. to one, two, or three. The expression "a plurality of" refers herein to any positive integer starting from two (2), e.g. to two, three, or four.

DETAILED DESCRIPTION OF THE DRAWINGS

Detailed embodiments of the present invention are disclosed herein with the reference to accompanying drawings.

Figure 2:
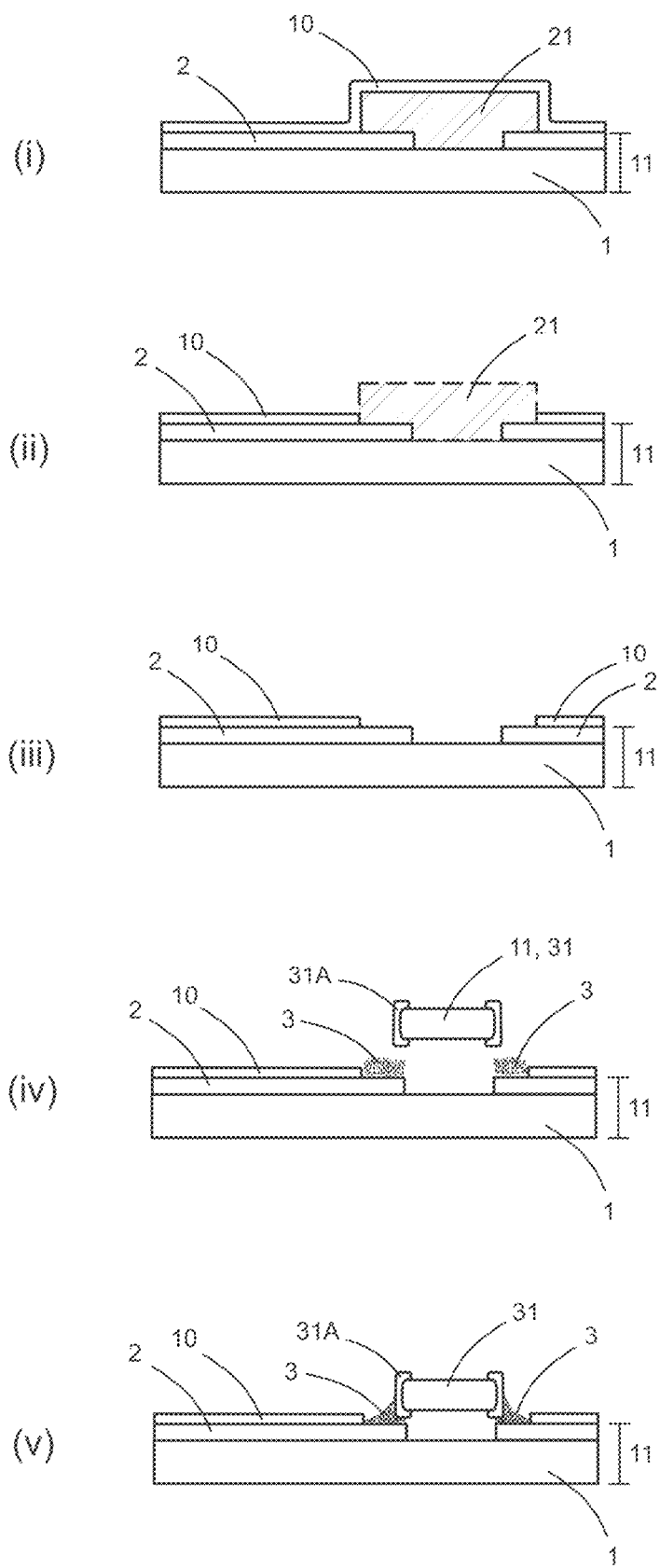
FIGS. 2 and 3 illustrate a method for formation of a patterned solder mask during manufacturing of a printed circuit board and/or an electrical component, in accordance to various embodiments.
Figure 3:
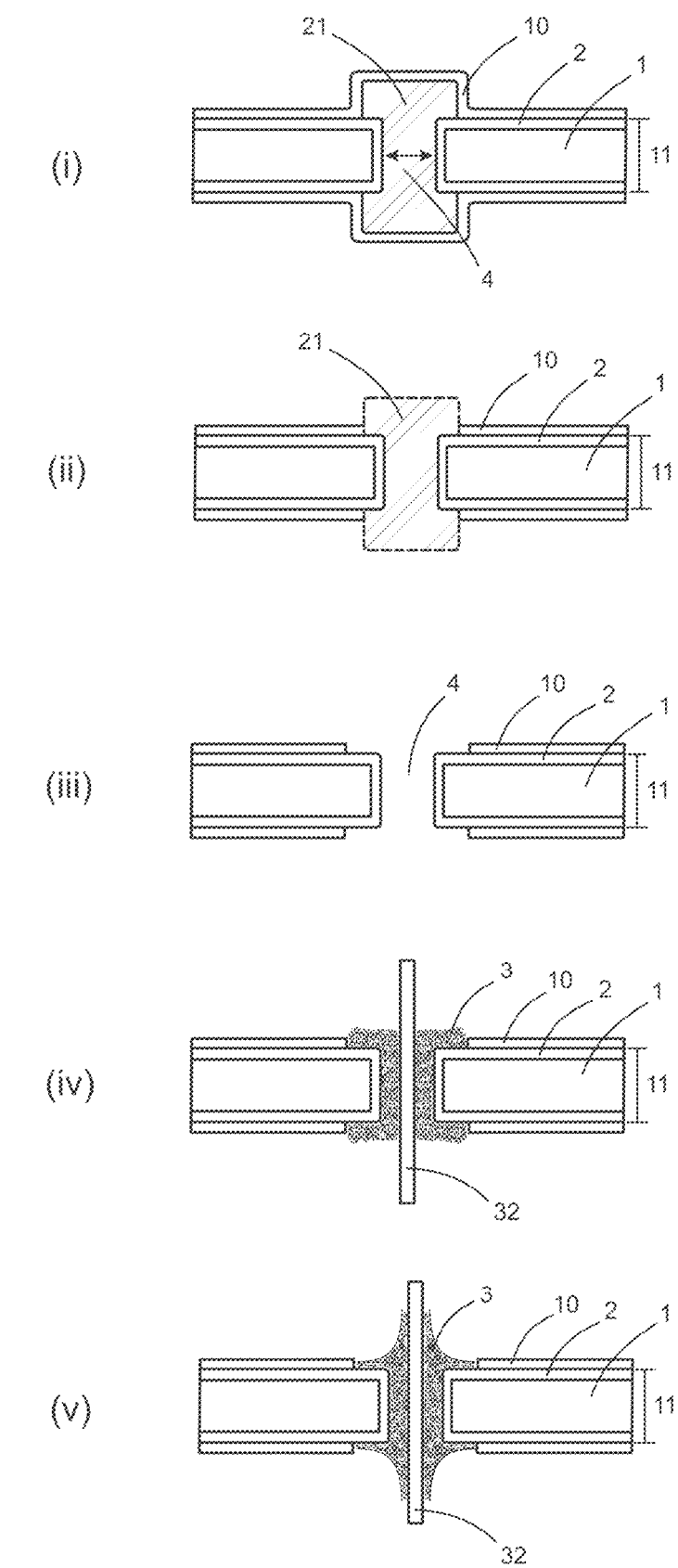

A method for formation of a patterned solder mask layer 10, hereafter, a mask 10, on a substrate 11 is provided. The substrate 11 can be provided as a printed circuit board that comprises at least one base layer 1 made of epoxy laminate with optional glass fiber re-enforcement, or of any other suitable material, which base layer is laid, at least in part, with conductive material 2, such as copper or silver (FIGS. 2, 3). In most instances, pure copper is utilized.

The conductive material 2 can be provided as a conductive layer/a coating for essentially large surfaces or as a path (as essentially thin strip of metal), the latter being typically formed by etching.

In some instances, printed circuit board can refer to hybrid electronics. In such an event, the board comprises at least one ceramic base layer 1 (instead of organic epoxy laminate with optional glass fiber enforcement), said base layer being laid with conductor paths made of silver by additive printing, instead of being etched from copper.

Additionally or alternatively, the substrate 11 can be provided as an electronic- or electrical component, also known as a component for building electric circuits; hereafter, an "electrical component" or a "component". The substrate 11 can thus be configured as said electrical component or components. The substrate 11 can be further configured as the PCB with a number of electrical components attached thereto.

Mentioned component can be configured as a bare or encapsulated integrated circuit element, for example. The method for mask formation disclosed hereby is applicable to any electrical component, including, but not limited to transistors, resistors, capacitors, diodes, and the like. Any predefined area on said component or parts thereof, such as wires, pins, etc., can be masked. In fact, the method disclosed hereby is applicable to any surface, on which a mask pattern should be applied with the purpose of limiting metal wetting and the flow resulted from said wetting, such as onto connectors and enclosures (casings). The surfaces include essentially planar- and non-planar surfaces. Non-planar surfaces are the surfaces comprising discontinuous features (profiles) such as cavities, corrugations and/or other irregularities. The features can be three-dimensional (employing length, width and height). Mentioned planar- and non-planar surfaces can further include apertures, such as through-cut apertures (via contacts). Thus, the mask pattern can be applied, by the method disclosed hereby, on complex, three-dimensional substrates including at least some of the above-mentioned features. The substrate can comprise any one of the non-planar surfaces (blind apertures or cavities) and through-apertures (via contacts) or a combination thereof.

An exemplary component soldered to the (masked) PCB substrate is indicated on FIG. 2 by reference numeral 31. For clarity reasons, formation of the patterned solder mask 10 on the component 31 is not shown; however, it is assumed that the skilled reader shall be able to perceive mentioned implementation based on the teachings of FIGS. 2 and 3 and related description.

FIG. 2 illustrates formation of the patterned solder mask layer 10 on an essentially uniform substrate 11, whereas FIG. 3 shows the same on the substrate comprising a via contact 4. In shown configurations the substrate is PCB.

In some embodiments, the mask 10 is deposited on the substrate 11 utilizing lift-off patterning techniques.

A lift-off material 21 is pre-applied onto the substrate surface within predefined regions, such as the regions intended to accommodate contacts, interconnects (FIG. 2) and/or via contacts (FIG. 3). Lift-off material 21 is thus applied to a number of spatially restricted areas on the substrate surface, to cover a base layer 1 and, at least partially, a conductive metal layer 2 (FIG. 2, i, ii). FIG. 3 shows configuration, in which the lift-off material 21 is applied at a position of the via contact 4 (provided as an aperture in the substrate 11). The lift-off 21 penetrates through said via contact 4 and fills the related aperture as shown on FIG. 3 (i, ii). Lift-off 21 can be applied by dispensing (FIGS. 2, 3) or by dipping a desired element (such as component wire, for example) into lift-off solution. Any other appropriate subtractive patterning methods can be utilized.

In preferred embodiments, the lift-off material 21 is water-soluble. In some instances, the lift-off 21 is a water-soluble polymer, such as polyvinyl alcohol (PVA), for example. In a non-limiting manner, this should be understood to include pure PVA, as well as a variety of mixtures that contain said soluble polymer to an extent that a pre-defined degree of solubility in aqueous solutions can be attained. PVA is a synthetic polymer with a hydroxyl group in its structure. PVA is synthesized by polymerization of vinyl acetate to polyvinyl acetate followed by hydrolysis to obtained polyvinyl alcohol.

Additionally, natural water-soluble polymers synthetized by modifying starch and cellulose can be utilized. In particular, natural polymers with high melting temperature (above 150° C.) can be utilized, including but not limited to carboxymethyl cellulose (CMC), ethyl cellulose (EC) and hydroxyethyl cellulose (HEC).

Polylactic acid (PLA) can be further provided as a blend with water-soluble polymers. Pure PLA is a hydrophobic polymer which does not solubilize or disperse in water.

In some instances, the lift-off material 21 can be selected to solubilize in aqueous solutions of alcohols. In some instances, an aqueous solution of isopropanol can be utilized as a solvent for PVA.

Having the lift-off material 21 pre-applied onto the substrate 11, the substrate further undergoes a process of chemical deposition in vapor phase. During chemical deposition an entire surface area of the substrate including the lift-off 21 is deposited with the mask layer 10 (i, FIGS. 2, 3).

One-side or double-side mask deposition can be attained, as depicted on FIGS. 2 and 3, accordingly.

In preferred embodiments, the mask 10 is deposited by a process of atomic layer deposition (ALD).

ALD is based on alternating self-saturative surface reactions, wherein different reactants (precursors) provided as chemical compounds or elements in a nonreactive (inert) gaseous carrier are sequentially pulsed into a reaction space accommodating a substrate. Deposition of a reactant is followed by purging the substrate by inert gas. Conventional ALD cycle proceeds in two half-reactions (pulse first precursor—purge; pulse second precursor—purge), whereby a layer of material is formed in a self-limiting (self-saturating) manner, typically being 0.05-0.2 nm thick. The cycle is repeated as many times as required for obtaining a film with a predetermined thickness.

The ALD process can be implemented utilizing a variety of reactants and sub-processes (e.g. plasma enhanced ALD, PEALD). Some reactants can be deposited even at room temperature (about 20° C.); however, to attain improved moisture barrier properties, higher deposition temperatures, such as 250-300° C. are preferred.

During ALD process, certain materials used for lift-offs 21 pre-applied on the substrate may start to soften. Softening may continue to a point at which ALD reactions cease to proceed at the substrate surface, which results in incomplete film growth on said lift-offs 21 or even in an absence of such growth.

To prevent softening, mask formation process can be initiated at lower temperatures, as compared to temperature ranges typical for chemical deposition reactions in vapor phase. Thus, during formation of a mask film with desired thickness about 100 nm, a number of layers (to attain film thickness to an extent of 10 nm, for example) can be grown at 50° C.; whereas the rest of the layers (to an extent of 90 nm) can be grown at 125° C., for example.

Still, in an event the deposition process results in formation of an incomplete coating over the lift-off 21, formation of such faulty coatings could be turned beneficial in view of facilitated removal of said lift-off 21 (as described hereinbelow).

By the way of an example, ALD deposition of the mask layer 10 may be implemented in an ALD installation described in the U.S. Pat. No. 8,211,235 (Lindfors), for example, or on the installation trademarked as Picosun R-200 Advanced ALD system available from Picosun Oy, Finland.

The deposited mask 10 is thus composed of (polymer-free) inorganic material, preferably, an insulator. In some configurations, the mask is composed of a metal oxide. A metal compound for said metal oxide is selected from the group including, but not limited with: aluminum (Al), titanium (Ti), zirconium (Zr), vanadium (V), hafnium (Hf), tantalum (Ta), niobium (Nb), molybdenum (Mb) and wolfram (W).

The abovementioned metal compounds (in the form of oxides) can be used to manufacture laminates comprising a number of selected layers at a time, such as an $Al_2O_3$ layer and a $TiO_2$ layer, for example. Additionally, said laminates can comprise a number of organic layers conventionally known to be deposited with molecular layer deposition (MLD), a subclass of ALD.

A number of non-limiting examples for the formation of mask 10 based on ALD techniques are presented hereinbelow. All exemplary reactions have been conducted on the apparatus R-200 Advanced ALD system available from Picosun Oy.

Example 1. The mask 10 provided as a layer of aluminum oxide ($Al_2O_3$) has been formed on the substrate 11 from trimethylaluminum (TMA, $Al(CH_3)_3$) and water. Deposition temperature varies within a range of about 20° C. (room temperature) to about 300° C.

Example 2. The mask 10 provided as a layer of titanium dioxide ($TiO_2$) has been deposited on the substrate 11 from titanium tetrachloride (TiCl4) and water. Deposition temperature varies within a range of about 20° C. (room temperature) to about 300° C.

Example 3. The mask 10 provided as a layer of niobium dioxide ($Ni_2O_5$) has been deposited on the substrate 11 from niobium ethoxide ($Nb_2(OC_2H_5)_{10}$) and water. Deposition is possible at least within a range of 90° C. to 150° C.

In all examples, a layer produced in a single ALD cycle (pulse first precursor—purge; pulse second precursor—purge) has been approximately 0,1 nm. In order to deposit a layer with thickness 10-100 nm, mentioned reactions (cycles) are repeated a predetermined number of times. The deposition procedure may be thus completed within a time range of about 10 minutes to about 20 hours depending on a number of cycles required and duration of each cycle.

For the purposes of the invention it is preferred that the mask 10 is deposited as a layer having thickness within a range of 10-500 nm, preferably, within a range of 20-200 nm, more preferably, within the range of 50-200 nm, such as 100 nm.

In similar manner, the mask 10 can be established from three or more precursors.

In some instances, the mask 10 can be established from a single precursor compound. The procedure advantageously exploits the principles of photo-assisted atomic layer deposition (hereby, photo-ALD), wherein surface film deposition reactions are triggered by photons delivered onto the substrate surface (while the latter being pulsed with precursor) via exposing the substrate to electromagnetic radiation of at least one wavelength within a predetermined wavelength range. Ultraviolet radiation (100-400 nm), visible light (400-800 nm), or infrared radiation (over 800 nm) can be utilized. In such an event the ALD reactor is advantageously equipped with an appropriate radiation source. Selection of the areas for photo-exposure is implemented by shadowing or by directing (scanning) radiation to predetermined regions by tilting mirrors, for example, whereby ALD growth can be limited to predetermined regions.

Deposition/formation of the mask 10 is advantageously implemented at a temperature equal to or below 150° C., preferably, equal to or below 125° C. In some instances, deposition process can be implemented at the temperatures higher than 150° C., depending on the melting point of the lift-off material 21.

By thorough selection of precursor fluids for the chemical deposition process, formation of essentially optically transparent mask layers can be attained. The mask 10 deposited at step i (FIGS. 2, 3) is preferably optically transparent (see-through). By such an arrangement, any markings pre-applied onto the substrate 11 (e.g. the conductor 2), can be easily identified. Optically transparent mask can further facilitate post-processing by laser ablation, such as fast laser ablation techniques utilized in display patterning.

A variety of CVD, including ALD processes are sensitive to moisture (e.g. atmospheric moisture). From Examples 1-3 one may notice that water is often utilized as a component to chemical reaction (a precursor). Additionally, moisture may originate from any substance intrinsic to the substrate or the substance being laid onto said substrate. Release (vaporization) of such moisture may occur during chemical deposition reaction, in particular, before heating temperature reaches 100° C. Hence, moisture can have an impact on the chemical deposition process.

In this regard, in an event the substrate 11 and/or the lift-off material 21 comprise or consist of moisture-containing material(s), in order to obtain a mask layer of desired quality, moisture has to be removed from the substrate and/or the lift-off prior to subjecting the latter to chemical deposition.

It is preferred that prior to conducting chemical deposition reaction(s), the substrate 11 pre-supplied with the water-soluble lift-off material 21 is degassed until a predetermined moisture level is attained.

Degassing can be realized in a reaction chamber of an exemplary ALD reactor, optionally implemented as an installation mentioned hereinabove. With the substrate 11 placed into said reaction chamber, degassing can be monitored with an at least one external detector or sensor, configured as a residual gas analyzer (RGA), for example. Degassing process is thus continued until a predetermined moisture level (in the substrate) is attained. Depending on the product to be obtained, desired moisture level can be provided as: $<1/100$, preferably, $<1/1000$, more preferably, $<1/10000$, still more preferably, <1 ppm, the most preferred, <1 ppb of degassing molecules, such as water, for example, in the fluid (such as gas) evacuated from the chamber accommodating said substrate. Lack of sufficient degassing leads to formation of ALD coatings of poor-quality and to particle formation (which is undesired). Electronic devices supplied with PCBs and/or components comprising such poor-quality (mask) coatings experience failures independent on their use and age. Equipment with degassing option is available, for example, as the abovementioned apparatus R-200 with an optional gas analyzer (Picosun Oy, Finland).

The lift-off material may enable full or partial growth of the ALD or CVD film on top of it. Hence, the growth may be complete or incomplete. The lift-off material can be selected such, as to hinder growth initialization of said film. Additionally or alternatively, the growth of the film can be partly or fully prevented by the combination of deposition chemicals, process conditions and the said mask. Here the lift-off may refer to a conventional lift-off process, where the material on its surface is removed, or to a process, where the deposited film growth is affected by the lift-off material. Described lift-off technique is beneficial in terms that the deposition of even deficient layer(s) on the polymeric surface optionally accompanied with polymer melting, implies no detrimental consequences to the masking process (due to subsequent removal of the lift-off).

At step i (FIGS. 2, 3), the entire surface of the substrate 11 (the surface exposed to precursor fluids) is deposited with the (mask) layer 10.

At step ii, the layer 10 is removed at lift-off 21 locations followed- or accompanied by removal of the lift-off material 21 from the substrate. In most instances, the layer 10 can be effectively removed during dissolving/solubilizing the lift-off 21 in water or in in aqueous solvent. We note hereby that the layer 10 deposited by the chemical deposition process preferably does not exceed, in terms of thickness, 1 μm, still preferably, 500 nm; therefore, it can be easily removed upon dissolving the lift-off 21. In some instances, removal of the layer 10 from the lift-off locations can be assisted by mechanical impact, such as temperature difference between the substrate and the solvent utilized, for example. Additionally or alternatively, removal of the layer 10 from the lift-off locations can be assisted by photon absorption, such as laser ablation, for example.

Removal of lift-off 21 is advantageously realized by placing the substrate 11 into an aqueous solution. Experiments, underlying the present invention had guided the inventor to a surprising outcome that without any special actions, in said aqueous solution the inorganic mask layer breaks down to expose water-soluble polymer to aqueous environment, in where lift-off polymers dissolve.

The method disclosed hereby allows for formation of a mask pattern with resolution less that 10 µm.

Figure 1:
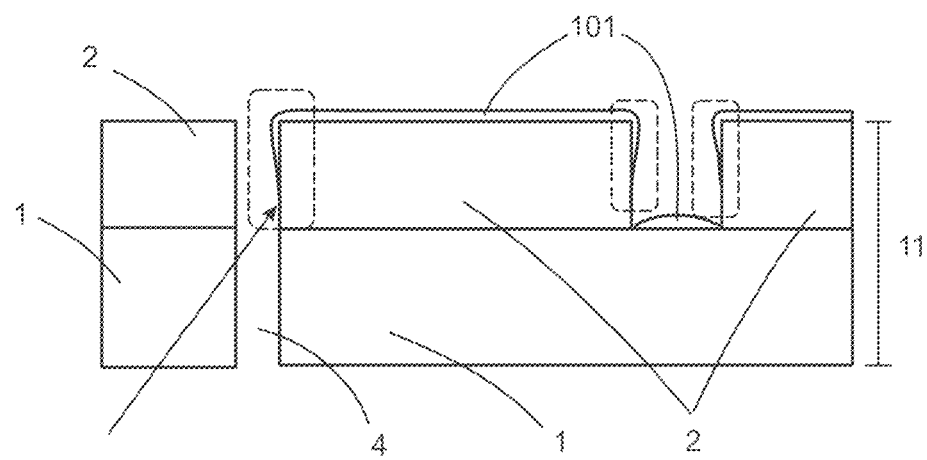
FIG. 1 schematically illustrates a substrate with a solder mask applied by a conventional process (prior art).

After removal of lift-off 21 optionally followed by rinsing, the patterned substrate 11 is obtained (iii, FIGS. 2, 3). The mask layer 10 provides conformal encapsulation for the unmasked areas, wherein the latter are the regions occupied by the lift-offs 21 during the deposition process. By such an arrangement, formation of gaps or maskless areas on conductive material (FIG. 1, dashed boxes) is effectively avoided.

Step iv (FIGS. 2, 3) illustrates application of a solder 3 onto the substrate 11 (onto unmasked areas of the substrate). Solder 3 can be a liquid tin-lead (SnPb) alloy, or more common nowadays Pb-free alloy known as 'SAC' (SnAgCu), referred, hereby as "tin solder". It is clear that other solder compositions can be utilized.

Solder 3 is advantageously applied onto conductive regions ("edges") that surround the unmasked areas. These are the conductive (e.g. copper) regions 2 that remain exposed after removal of the lift-off 21. Conductive regions 2 are easily wetted by solder on the contrary to the base (epoxy or ceramic) layer 1; however, horizontal flow of liquid solder alloy is effectively prevented by the mask 10 (iv, FIGS. 2, 3).

Figure 4A:
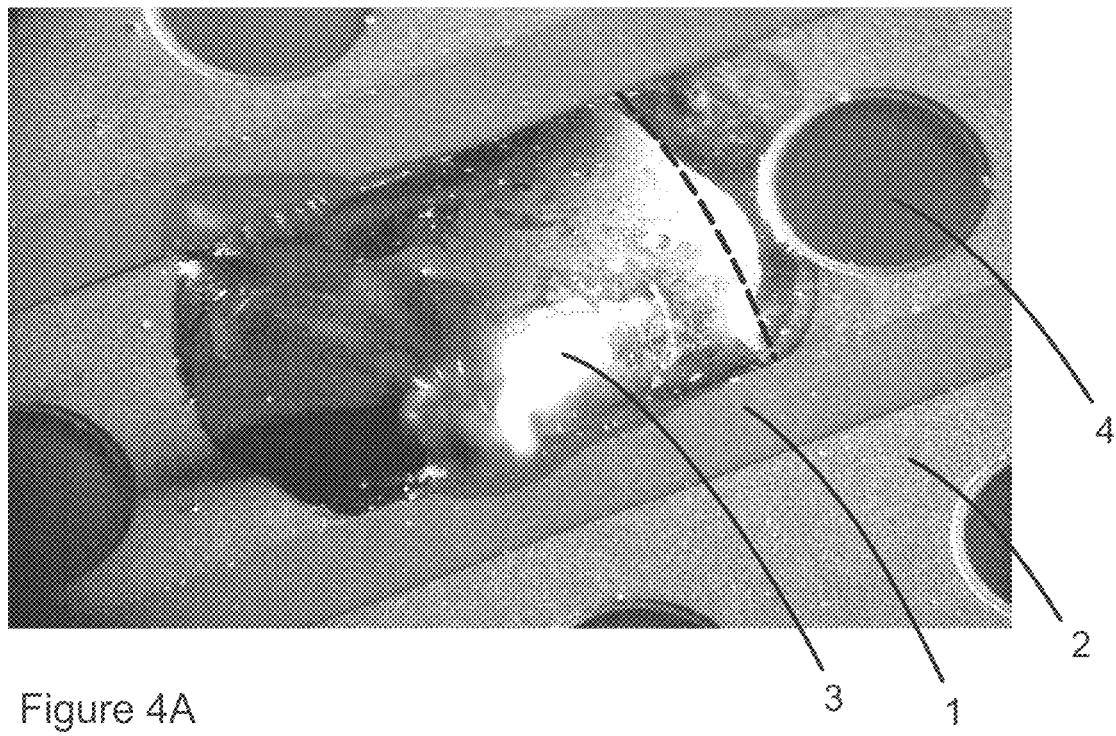
FIGS. 4A and 4B uncontrolled solder spreading on the substrate in an absence of the patterned solder mask, viewed from the top.
Figure 4B:
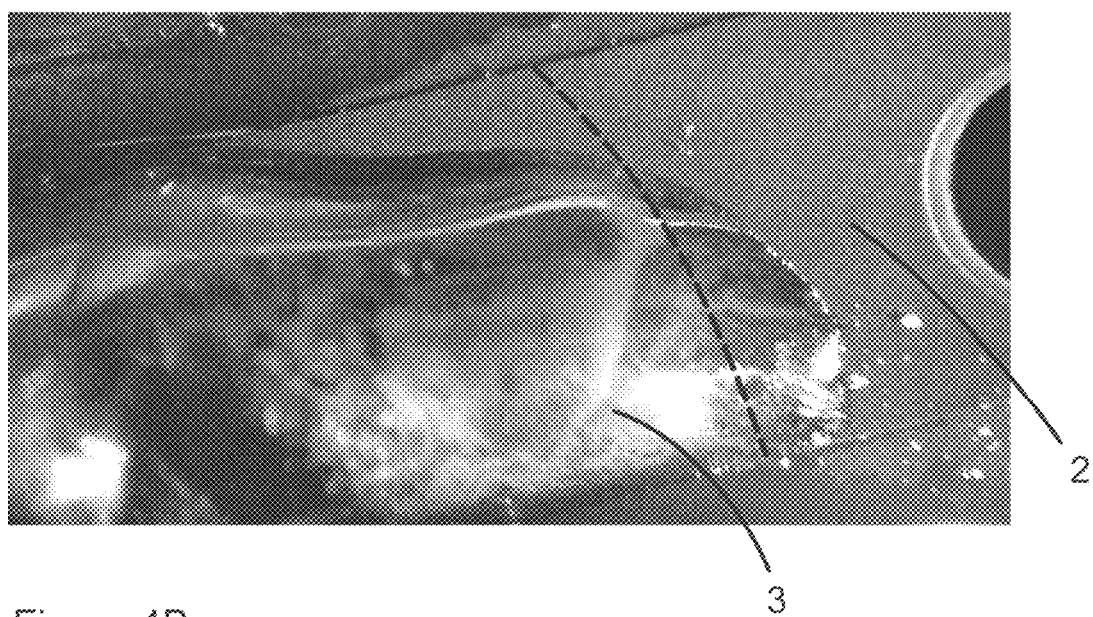

Prevention of horizontal solder flow is further illustrated by FIGS. 4A-4D. FIGS. 4A and 4B thus illustrate the substrate with a number of via contacts 4, said substrate comprising the base layer 1 partially laid with the conductive material 2, but in an absence of the solder mask 10. Dashed line is indicative of a border to which deposition of the solder 3 is desired. From FIGS. 4A and 4B one may observe that in an absence of the mask 10, the solder 3 spreads along the conductive material 2 on the substrate in an uncontrolled manner.

Figure 4C:
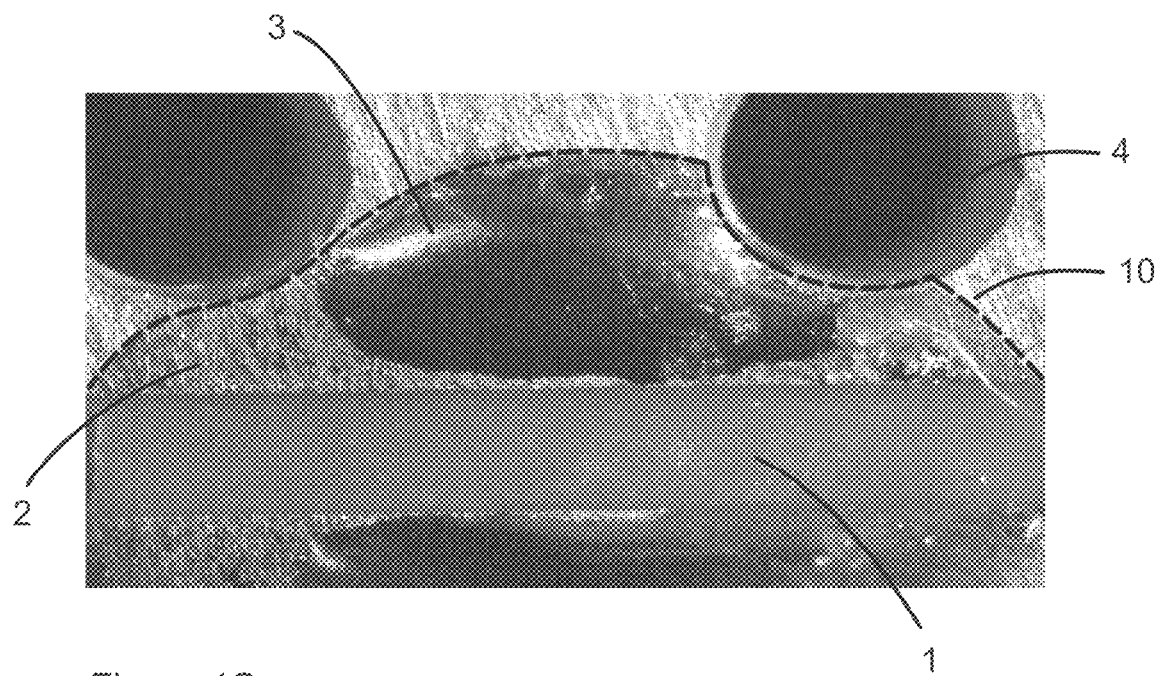
FIGS. 4C and 4D illustrate solder spread strictly within the limits set by the patterned solder mask, viewed from top and from the side, accordingly.
Figure 4D:
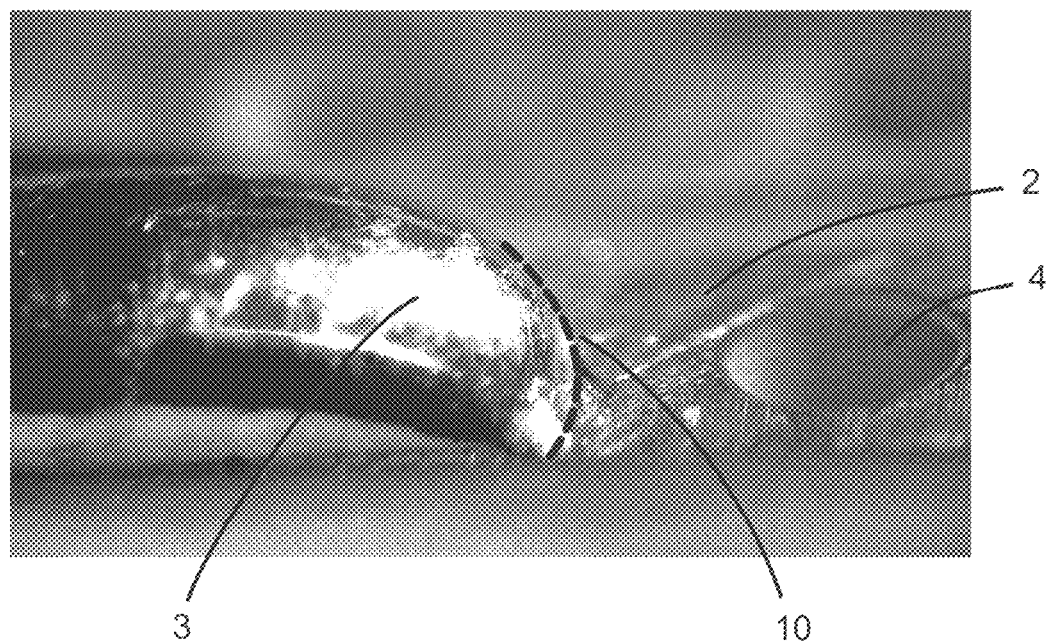

FIGS. 4C and 4D depict (top and side views, respectively) the same substrate deposited with the mask 10 (about 100 nm thick). Since the mask 10 is transparent, a border of the masked area is indicated by a dashed line. From FIGS. 4C and 4D one may observe that the mask 10 effectively prevents solder alloy 3 from spreading outside the borders designated by the mask. Solder drop shown on FIG. 4C is too small to spread along an entire "border" indicated by the dashed line; however FIG. 4C clearly shows said solder conforming to the shape of the mask deposition layer 10. FIG. 4D illustrates a stop line between the solder 3 and the mask 10 viewed from the side.

The reference is made back to FIGS. 2 and 3. At iv and v, FIG. 2 illustrates a process of soldering the component 31 (optionally having the mask 10 formed by the method described hereinabove) onto the substrate. The component 31 comprises metallization areas 31A (typically nickel or gold alloys) that form contacts, via soldering, to (unmasked) conductive regions 2. FIG. 3 illustrates soldering a wire 32 to the via contact 4. Soldering is conducted at a temperature range within 250-300° C. by annealing (in a reflow oven, by a manual soldering iron or by hot-air soldering). During soldering there is a reflow of solder alloy (v, FIGS. 2, 3), whereby the solder 3 acquires a characteristic shape caused by surface tension that can be used for self-alignment as being assistive in placing the component at a correct position.

The process described above enables manufacturing printed circuit boards and/or electrical components. In some instances, the manufacturing method further comprises deposition of at least one protective layer onto a surface of an item, such as printed circuit board and/or the electrical component, manufactured by the process of chemical deposition in vapor phase, preferably, by the process of atomic layer deposition.

Thus, the exemplary (PCB) substrate 11 comprising inorganic mask layer(s) 10 deposited by an exemplary ALD process is obtained (iii, FIGS. 2, 3), followed by soldering the components 31, 32 onto said substrate (iv, v, FIGS. 2, 3). The manufactured item (e.g., PCB) is further deposited with at least one protective layer, such as a metal oxide layer, by the methods of chemical deposition in vapor phase, preferably, ALD, in accordance to what has been described hereinabove.

ALD technique can thus be used for encapsulation of solder alloys against formation of tin whiskers, which has turned out to be a more significant problem with Pb-free solder, than with SnPb solder. Relevant process is described in the International Application publication WO 2017/178690 (Pudas) that concerns deposition of ALD layers on tin substrates.

Provision of the inorganic mask layer 10 underneath the additional protective inorganic layer enhances adhesion, as well as mechanical- and thermal durability of the manufactured items, in comparison to a conventional situation, when the solder mask is (organic) polymer. Metal compound-based (and therefore mechanically hard) protective layer disposed over the manufactured item (e.g. PCB) is more likely to break under mechanical stress when laid onto an essentially soft material (viz. conventional polymeric mask) than onto the hard material (the solder mask formed according to the present disclosure).

An exemplary process for mask formation and an associated process for manufacturing of printed circuit boards and/or electrical components comprise the following steps:
  obtaining a substrate 11;
  applying water-soluble lift-off material 21 over the substrate to create a lift-off pattern, optionally preceded by drying;
  depositing an inorganic mask layer 10 onto the substrate 11 pre-supplied with the water-soluble lift-off 21 by chemical deposition in vapor phase, preferably, by atomic layer deposition;
  removal of the lift-off 21 to expose the unmasked regions; and optionally
  soldering components onto the unmasked regions; and optionally
  applying a protective inorganic layer over an entire structure by chemical deposition in vapor phase, preferably, by atomic layer deposition.

In some instances, it is beneficial to apply the solder mask 10 onto both the PCB and the electrical components to be joined by soldering. Such procedure brings forth an unexpected benefit of enabling self-alignment of components (on the PCB) with yet higher resolution, due to surface tension of the liquefied solder.

It is clear to the skilled reader that patterns created by the mask 10 can be provided in various sizes and shapes, such as square shapes or bar-shapes created around the apertures (via contacts) to attain desired (solder) wetting patterns around said apertures.

In alternative configurations, the patterning process can be implemented by laser ablation. In such an event provision of lift-off elements 21 can be omitted. The substrate 11 deposited by the mask layer 10 is subjected to laser ablation, whereby areas devoid of the mask layer 10 can be created with high-precision. As mentioned hereinabove, laser ablation is facilitated by the fact that the ALD deposited mask 10 is transparent. Subtractive pattering by laser ablation enables patterning resolution higher than 10 µm. The solder will spread and/or wet only the laser-ablated surfaces void of the mask layer 10. The mask is thus configured to provide conformal encapsulation for unmasked areas. It is assumed that a person skilled in the art will be aware that the method of laser ablation is also applicable onto the non-planar surfaces, which include the features of different shape and/or height, by adjusting the laser focus point.

Described procedures can be effectively utilized upon production of printed circuit boards and/or electrical components. A process for manufacturing the PCB and/or the electrical component by the method comprising formation of the mask layer 10 as described hereinabove, and a related item comprising said patterned solder mask and configured as the printed circuit board and/or the electrical component, constitute further aspects of the present invention.

In an aspect, an item, comprising a patterned solder mask 10 is provided. In the embodiment, said item is configured as a printed circuit board and/or an electrical component and comprises a substrate 11 with at least one base layer 1 laid, at least partly, with a conductive material 2 and a patterned solder mask 10 deposited onto said substrate 11, optionally, onto the conductive material 2 by a process of chemical deposition in vapor phase, wherein patterning is implemented via lift-off patterning with water-soluble lift-off material 21 and wherein the substrate comprises apertures and/or non-planar surfaces.

It shall be appreciated by those skilled in the art that the embodiments set forth in the present disclosure may be adapted and combined as desired. The disclosure is thus intended to encompass any possible modifications of the device and the deposition method, recognizable by those of ordinary skill in the art, within a scope of appended claims.

The invention claimed is:

1. A method for formation of a patterned solder mask layer on a substrate including one or more of at least one aperture and at least one non-planar surface, the method comprising:
    applying a water-soluble lift-off material over the substrate to create a lift-off pattern, the lift-off material, when applied at a position of the one or more of the at least one aperture and the at least one non-planar surface on the substrate, penetrating through and filling the one or more of the at least one aperture and the at least one non-planar surface;
    depositing, in an apparatus for chemical deposition in vapor phase, the mask layer onto the substrate applied with the water-soluble lift-off material; and
    removing the lift-off material to expose unmasked regions.

2. The method of claim 1, wherein the lift-off material is water-soluble polymer.

3. The method of claim 1, wherein the lift-off material is polyvinyl alcohol.

4. The method of claim 1, wherein the mask layer is inorganic material.

5. The method of claim 1, wherein the mask layer is metal oxide.

6. The method of claim 1, wherein the mask layer is optically transparent.

7. The method of claim 1, further comprising degassing the substrate applied with the water-soluble lift-off material until a predetermined moisture level is attained in the substrate, the degassing being performed in a reaction chamber of the apparatus for chemical deposition.

8. The method of claim 1, in which the mask layer is deposited by of atomic layer deposition.

9. The method of claim 1, in which the mask layer is deposited by photo-assisted atomic layer deposition.

10. The method of claim 1, wherein the mask layer is deposited at a temperature equal to or below 150° C.

11. The method of claim 1, wherein the mask layer has a thickness within a range of 10-500 nm.

12. The method of claim 1, wherein the substrate is one or more of a printed circuit board and an electrical component.

13. A method for manufacturing one or more of a printed circuit board and an electrical component, the one or more of the printed circuit board and the electrical component including one or more of at least one aperture and at least one non-planar surface, the method comprising:
    applying a water-soluble lift-off material over the substrate to create a lift-off pattern, the lift-off material, when applied at a position of the one or more of the at least one aperture and the at least one non-planar surface on the substrate, penetrating through and filling the one or more of the at least one aperture and the at least one non-planar surface;
    depositing, in an apparatus for chemical deposition in vapor phase, a solder mask layer onto the substrate; and
    removing the lift-off material to expose unmasked regions.

14. The method of claim 13, further comprising depositing a protective layer onto a surface of the one or more of the manufactured printed circuit board and the electrical component by chemical deposition in vapor phase.

15. The method of claim 14, wherein the protective layer is deposited by atomic layer deposition.

16. The method of claim 13, wherein the water-soluble lift-off material is applied onto a conductive material, and
    the solder mask layer is deposited onto the conductive material applied with the water-soluble lift-off material.

* * * * *